United States Patent [19]

Des Rosiers et al.

[11] Patent Number: 5,495,184

[45] Date of Patent: Feb. 27, 1996

[54] HIGH-SPEED LOW-POWER CMOS PECL I/O TRANSMITTER

[75] Inventors: Andre P. Des Rosiers, Menlo Park; Paul D. Ta, San Jose, both of Calif.

[73] Assignee: VLSI Technology, Inc., San Jose, Calif.

[21] Appl. No.: 371,724

[22] Filed: Jan. 12, 1995

[51] Int. Cl.$^6$ .............................................. H03K 19/0185
[52] U.S. Cl. .............................. 326/73; 326/33; 326/83; 327/541
[58] Field of Search .................................. 326/33, 73–74, 326/83; 327/52, 56, 73, 539, 541

[56] References Cited

U.S. PATENT DOCUMENTS

| | | | |
|---|---|---|---|
| 4,490,670 | 12/1984 | Wong | 323/313 |
| 4,656,372 | 4/1987 | Sani et al. | 326/81 |
| 4,763,021 | 8/1988 | Stickel | 326/33 |
| 5,081,380 | 1/1992 | Chen | 327/541 |
| 5,089,723 | 2/1992 | Davis et al. | 326/73 |
| 5,216,297 | 6/1993 | Proebsting | 326/83 |
| 5,365,127 | 11/1994 | Manley | 326/73 |
| 5,373,199 | 12/1994 | Shichinohe et al. | 327/328 |
| 5,410,267 | 4/1995 | Haycock et al. | 326/81 |
| 5,430,396 | 7/1995 | Morano | 326/90 |

OTHER PUBLICATIONS

"CMOS Subnanosecond True–ECL Output Buffer" by Hans–Jurgen Schumacher, Jan Dikken, and Evert Seevinck; IEEE Journal of Solid–State Circuits, vol. 25, No. 1 Feb. 1990, pp. 150–154.

"Proceedings of the Third Annual IEEE ASIC Seminar and Exhibit" by Kenneth W. Hsu, Ph.D., P. E. and Mark E. Schrader. Presented at Rochester Riverside Convention Center, Rochester, New York on Sep. 17–21, 1990. IEEE Catalog #09TH0303–8.

"ECL–CMOS and CMOS–ECL Interface in 1.2–um CMOS for 150–MHz Digital ECL Data Transmission Systems" by Michael S. J. Steyaert, Pieter Vorenkamp, and Jan Sevenhans. *IEEE Journal of Solid–State Circuits*, vol. 26, No. 1, Jan. 1991, pp. 18–23.

"High–Speed CMOS I/O Buffer Circuits" by Manabu Ishibe, Shoji Otaka, Junichi Takeda, Shigeru Tanaka, Yoshiaki Toyoshima, Satoru Takatsuka, and Shoichi Shimizu. *IEEE Journal of Solid–State Circuits*, vol. 27, No. 4, Apr. 1992, pp. 671–673.

"A 2–um CMOS Digital Adaptive Equalizer Chip for QAM Digital Radio Modems" by Stefan R. Meier, Erik De Man, Tobias G. Noll, Ulrich Loibl, and Heinrich Klar. *IEEE Journal of Solid–State Circuits*, vol. 23, No. 5, Oct. 1988, pp. 1212–1217.

*Primary Examiner*—David R. Hudspeth
*Attorney, Agent, or Firm*—Patrick T. King

[57] ABSTRACT

An output buffer contains a totem-pole structure of four CMOS transistors. The top two are PMOS devices and the bottom two are NMOS devices. The top and bottom transistors function as output current switches which alternatively turn on and off the current flow from either VSS or VDD to the resistive termination load Rt. The middle two devices are connected to DC voltage references which control a precise amounts of current sourced to a load using a precision current source and sunk from a load using and to a precision current sink. The reference voltages for the precision current source and the current sink uses a negative feedback circuit which is referenced to a resistor ladder and a current source controlled by a band-gap reference source. This allows for on-chip referencing of ECL levels and control of reference voltages and currents in spite of variation is process, voltage, and temperature. Internal ECL reference levels signals $V_{OL}$ and $V_{OH}$ are used to control the output levels. Operational amplifiers drive the respective transistors such that voltage at the drains of the current source and sink transistors equals the ECL reference inputs VOH and VOL. These control voltages generate a precise currents through a replica stage and are also applied to the output stage. All of the devices in the reference control circuit are scaled to reduce DC power dissipation. For differential operation, a second totem-pole driver circuit is used with the inverse input data signal for controlling the output current switches.

11 Claims, 5 Drawing Sheets

5,495,184

HIGH-SPEED LOW-POWER CMOS PECL I/O TRANSMITTER

TECHNICAL FIELD

The present invention relates generally CMOS-to-emitter coupled logic (ECL) drivers.

BACKGROUND OF THE INVENTION

Prior designs for a CMOS to ECL output buffer, which were designed to have an output voltage swing meeting 100 k ECL specifications and which maintained a termination voltage between ECL $V_{OH}$ and $V_{OL}$ have been found to dissipate 200 milliwatts for single-ended designs. These designs also use off-chip components to provide reference signals to the output buffers.

Thus, a need exists for an efficient high-speed CMOS to ECL line driver which can be fully integrated on a single chip.

SUMMARY OF THE INVENTION

A positive-shifted emitter coupled logic (PECL) driver, which is provided according to the invention, converts on-chip CMOS data to off-chip ECL data at 200 MHz with no external components. It is an object of the invention to provide an improved CMOS to ECL driver circuit. The circuit maintains an overall differential power dissipation below 75 milliwatts. The circuit operates at frequencies from 20 MHz to 200 MHz The circuit meets stringent. 100 k ECL specifications with a termination voltage $V_T$ between ECL $V_{OL}$ and ECL $V_{OH}$. The circuit is fully self-contained on-chip and requires no external components, such as resistors, for reference purposes. The circuit is able to drive large external load up to 25 picofarads. The design of the circuit is such that it can withstand variations in process, voltage, and temperature.

In accordance with these and other objects of the invention, the output buffer contains a totem-pole structure of four CMOS transistors. The top two are PMOS devices and the bottom two are NMOS devices. The outer one of the devices function as output current switches which alternatively turn on and off the current flow from either VSS or VDD to the resistive termination load Rt. The middle two devices are connected to DC voltage references which control a precise amount of current to the load RL. This structure provides for switching currents by switching the power supplies to a precision current source and to a precision current sink.

The control voltages for the precision current source and sink uses a negative feedback circuit which is referenced to a resistor ladder and a current source controlled by a band-gap reference source. This allows for on-chip referencing of ECL levels and control of reference voltages and currents in spite of variation is process, voltage, and temperature.

The internal reference generates internal ECL reference levels signals $V_{OL}$ and $V_{OH}$ which are used to control the output levels. Operational amplifiers drive the respective transistors such that voltage at the drains of the current source and sink transistors equals the ECL reference inputs VOH and VOL. Each of these control voltages generates a precise current through a replica stage and the control voltages are also applied to the output stages. All of the devices in the reference control circuit are scaled by a factor of 16 to reduce DC power dissipation. For differential operation, a second totem-pole driver circuit is used with the inverse input data signal for controlling the output current switches.

An output driver circuit according to the invention provides for single-ended or differential operation of the ECL output driver. A singled-ended circuit has a first termination resistance $R_{T1}$, which has one terminal connected to a first output terminal of the output driver circuit and which has the other terminal connected to a termination voltage source $V_T$. The circuit includes a first PMOS switch transistor M1, having a drain terminal, a source terminal, and a gate terminal, wherein said source terminal is connected to a $V_{DD}$ voltage source. A first switch means applies a first switching signal to the gate terminal of the first PMOS switch transistor M1 for turning on and off current flow from the $V_{DD}$ voltage source through the first PMOS switch transistor M1. A second PMOS current-source transistor M2 is provided having a drain terminal, a source terminal, and a gate terminal, wherein the source terminal of the second PMOS current-source transistor M2 is connected to the drain terminal of the first PMOS switch transistor M1 and wherein the source terminal of the second PMOS current-source transistor M2 is connected to the first output terminal of the output driver circuit. A first DC voltage reference source REF A is provided having an output terminal connected to the gate terminal of the second PMOS current-source transistor M2 for controlling the amount of current provided by the second PMOS current-source transistor M2 to the first termination resistance $R_{T1}$.

A first NMOS current-sink transistor M3 is also provided having a drain terminal, a source terminal, and a gate terminal, wherein the drain terminal is connected to the drain terminal of the second PMOS current-source transistor M2 and to the first output terminal of the output driver circuit. A second DC voltage reference source REF B is provided having an output terminal connected to the gate terminal of the first NMOS current-sink transistor M3 for controlling the amount of current provided from the first termination resistance $R_{T1}$ to the first NMOS current-sink transistor M3. A second NMOS switch transistor M4 is provided having a drain terminal, a source terminal, and a gate terminal, the source terminal being connected to a $V_{SS}$ voltage source, wherein the drain terminal of the second NMOS switch transistor M4 is connected to the source terminal of the first NMOS current-sink transistor M3 and wherein the source terminal of the second NMOS switch transistor M4 is connected to the $V_{SS}$ voltage source. A second switch means provides a second switching signal to the gate terminal of the second NMOS switch transistor M4 for turning off and on current flow to the $V_{SS}$ voltage source through the second NMOS switch transistor M4.

The first PMOS switch transistor M1, the second PMOS current-source transistor M2, the first NMOS current-sink transistor M3, and the second NMOS switch transistor M4 form one leg of a differential amplifier, which has the first termination resistance $R_{T1}$ connected between the output terminal and the termination voltage source $V_T$. Another similar leg is constructed for a differential amplifier configuration. A second termination resistance $R_{T2}$ has one terminal connected to a second output terminal of the output driver circuit and has the other terminal connected to the termination voltage source $V_T$.

The first DC voltage reference source REF A includes a first reference voltage source and a first operational amplifier having an output terminal, an inverting input terminal connected to the first reference voltage source, and a non-inverting input terminal. The first DC voltage reference REF A is provided at the output terminal of the first operational amplifier. A first replica stage includes a first PMOS transistor N1, having a drain terminal, a source terminal, and a gate terminal where the source terminal is connected to a $V_{DD1}$ voltage source and where the gate terminal is connected to a $V_{SS1}$ voltage source. The first replica stage also includes a second PMOS transistor N2, having a source terminal connected to the drain terminal of the first PMOS transistor N1, a gate terminal connected to the output terminal of the first operational amplifier, and a drain terminal connected to the non-inverting input terminal of the first operational amplifier and connected to one terminal of a resistor R;

A similar second DC voltage reference source REF B is also provided which includes a second reference voltage source and a second operational amplifier having an output terminal, having a inverting input terminal connected to the first reference voltage source, and having a positive input terminal. A second replica stage includes a first NMOS transistor N3, having a drain terminal, a source terminal, and a gate terminal, wherein the source terminal is connected to a $V_{SS1}$ voltage source, wherein the gate terminal is connected to the $V_{DD1}$ voltage source. The second replica stage also includes a second NMOS transistor N4, having a source terminal connected to the drain terminal of the first NMOS transistor N3, having a gate terminal connected to the output terminal of the second operational amplifier, and a drain terminal connected to the non-inverting input terminal of the second operational amplifier and connected to the other terminal of the resistor R. The second DC voltage reference REF B is provided at the output terminal of the second operational amplifier. The first reference voltage sources are provided by a current source in series with a reference resistor string.

The first replica stage also includes a similar parallel string of a third PMOS transistor N5, a fourth PMOS transistor N6, and means for connecting the gate terminal of the third PMOS transistor N5 to the $V_{SS1}$ voltage source to turn on the third PMOS transistor N5. This provides for accommodation of a different termination resistor value, RT1 for the output driver circuit. The second replica stage similarly includes a third NMOS transistor N7 and a fourth NMOS transistor N8 together with means for connecting the gate terminal of the third NMOS transistor N7 to the $V_{DD1}$ voltage source to turn on the third NMOS transistor N7 to provide for accommodation of a different termination resister value, RT for the output driver circuit.

The first switch means and second switch means each include a transmission gate for controlling the passage of data signals to the gate terminal of the switch transistors M1 and M4. Switch means are also provided for disabling switch transistors M1 and M4 during a powered-down condition.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention., examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
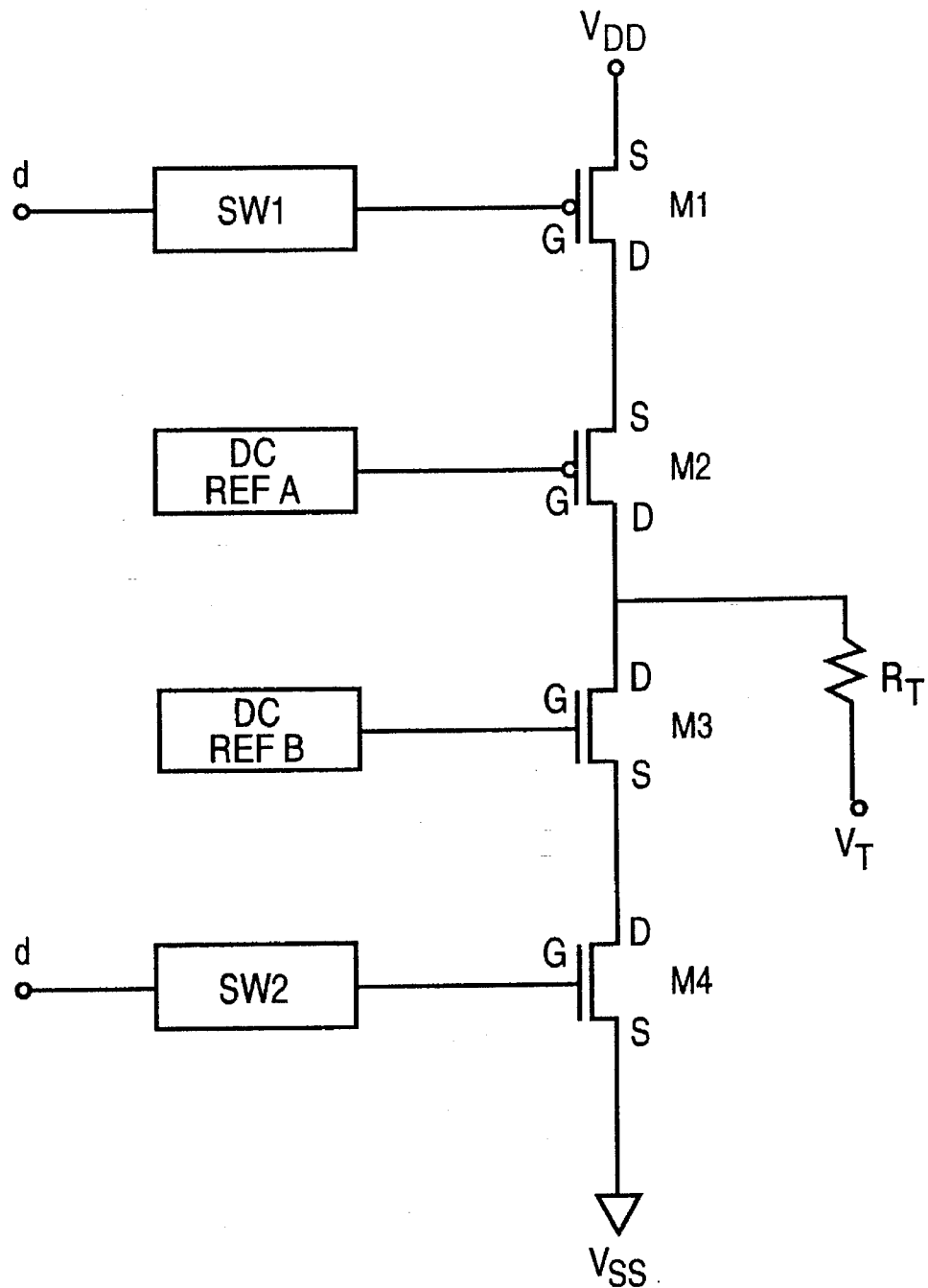
FIG. 1 is a simplified block diagram of a single-ended output driver circuit for a CMOS circuit providing an ECL-formatted signal.

FIG. 1 shows a simplified block diagram of a single-ended CMOS-to-ECL output driver circuit 100, which provides an ECL-formatted output signal. A positive-shifted emitter coupled logic (PECL) output driver circuit is provided which converts on-chip CMOS data to off-chip ECL data at up to 200 MHz. The circuit is designed to be fully contained on an integrated-circuit chip with an output signal swing meeting 100 k ECL specifications and maintaining a termination voltage $V_T$ between ECL $V_{OH}$ and $V_{OL}$.

The output driver circuit 100 contains a totem-pole structure of four MOS transistors where M1 and M2 are PMOS devices and where M3 and M4 are NMOS devices. The two transistors M1 and M4 function as switches to alternatively turn on and off the current flow sourced from $V_{DD}$ or sunk to $V_{SS}$ through a resistive termination load $R_T$ having a termination voltage $V_T$ applied to one end thereof. The circuit functions so that only one of M1 and M4 is on at the same time. A current source transistor M2 and a current sink transistor M3 have their gate terminals connected to respective DC voltage references REFA and REFB which control a precise amount of current sourced into or sunk from the load $R_T$. The data signals d provide CMOS switching signals to the gate terminals of M1 and M4 at up to 200 MHz through the switching circuits SW1 and SW2.

In operation, this circuit, for example, sources 8 MA to the load through devices M1 and M2 when d is 0 volts, RT where M3 and M4 are in the off state. Conversely, when d is 5 volts, devices M3 and M4 sink 8 mA from $V_T$ and the load $R_T$ to $V_{SS}$ where M1 and M2 are in the off state. Switching the power supply voltages to the current source and sink transistors M2 and M3 works for a variety of Vdd power supply voltage ranges, for example, from 5 Volts to 3 volts.

Figure 2:
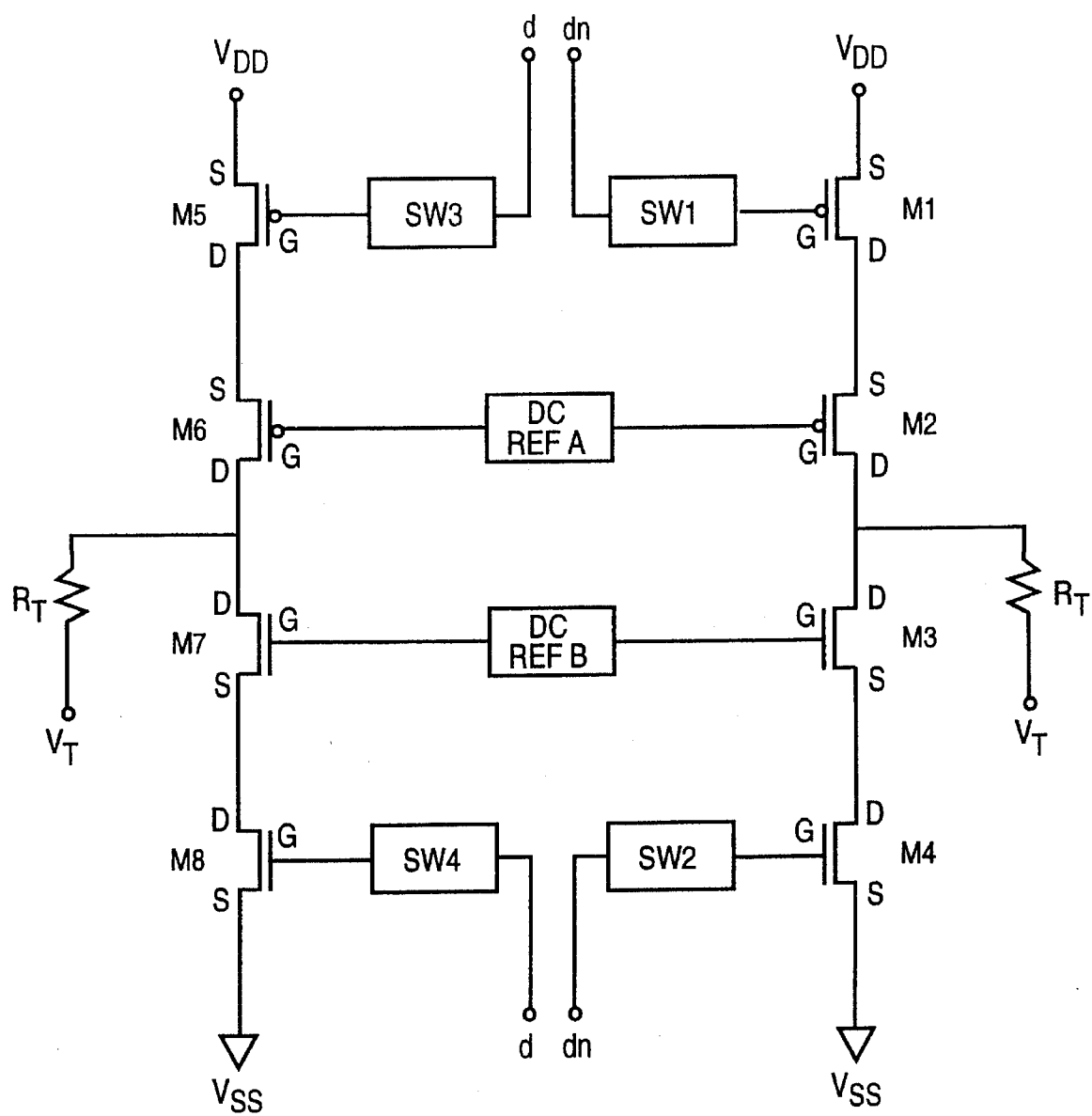
FIG. 2 is a simplified block diagram of a differential output driver circuit for a CMOS circuit providing an ECL-formatted signal.

FIG. 2 shows a simplified block diagram of a CMOS-to-ECL differential output driver circuit 200, which provides an ECL-formatted signal for a CMOS circuit providing an ECL-formatted differential output signal. For differential operation, the circuit elements of FIG. 1 form one leg of a differential amplifier. This one leg is used together with another leg formed with a similar totem-pole structure. The other leg is formed of four MOS transistors, where M5 and M6 are PMOS devices and where M7 and M8 are NMOS devices. Similar to the transistors of FIG. 1, the two transistors M5 and M8 also function as switches to alternatively turn on and off the current flow sourced from $V_{DD}$ or sunk to $V_{SS}$ through a second resistive termination load $R_T$, which also has a termination voltage $V_T$ applied to one end thereof.

A current source transistor M6 and a current sink transistor M7 have their gate terminals connected to the same respective DC voltage references REFA and REFB of FIG. 1, These voltage references also control a precise amount of current sourced into or sunk from the load $R_T$. The data signals $d_1$ $d_n$ provide, oppositely-phased switching signals to the gate terminals of M5, M8 and M1, M4 at up to 200 MHz through the switching circuits SW3, SW1, and SW2.

The operation of the differential circuit of FIG. 2 is similar to that of FIG. 1. The arrangement of FIG. 2 has two legs, each of which alternatively sources 8 MA to the load RT or sinks 8 mA from the load $R_T$ and termination voltage $V_T$.

Figure 3:
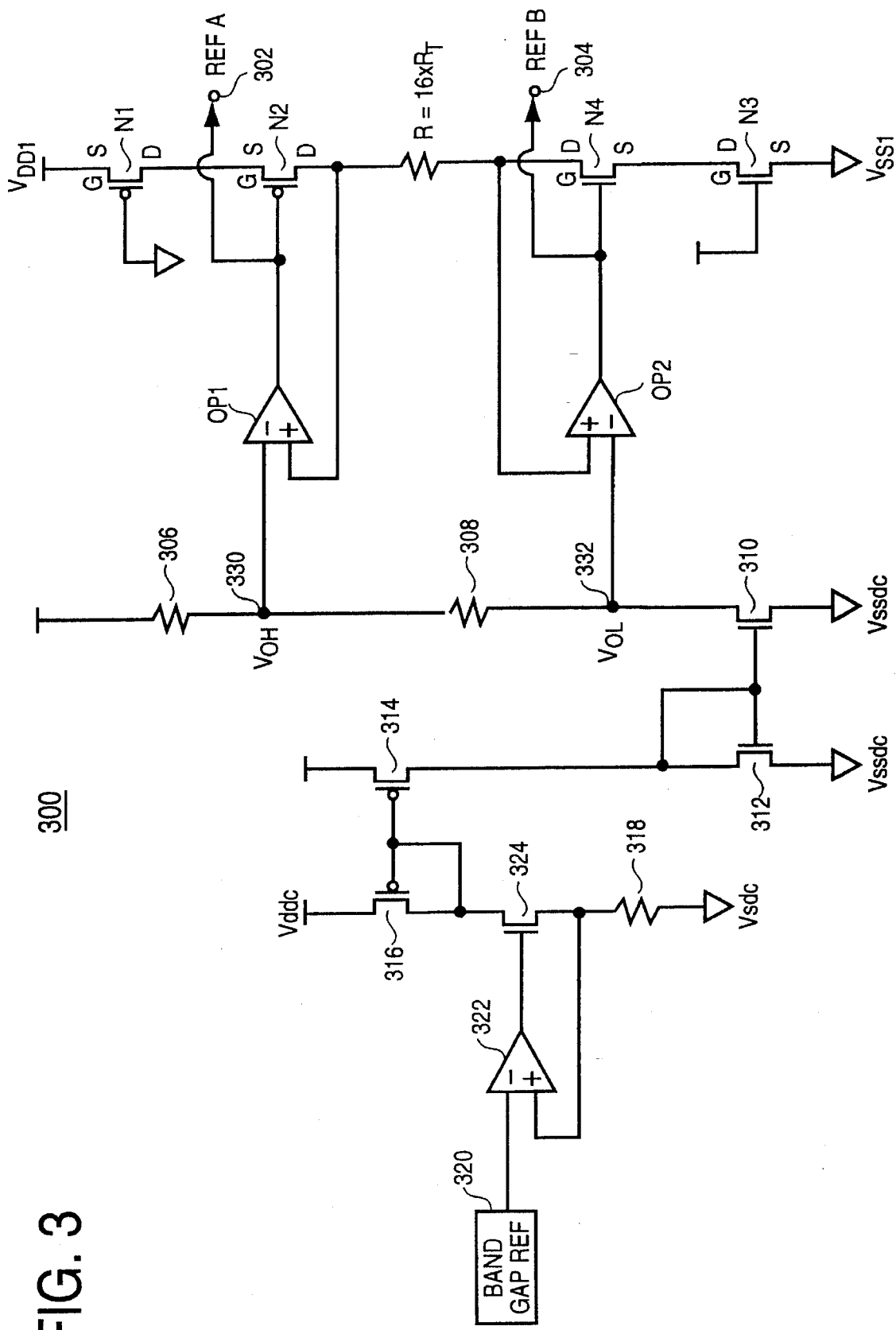
FIG. 3 is a circuit diagram of a DC voltage reference source used in connection with the output driver circuit according to the invention.

FIG. 3 is a circuit 300 which generates the two DC voltage references REFA at terminal 302 and REFB at terminal 304, which are used in the output driver circuits of FIG. 1 and FIG. 2, according to the invention. The voltage drive circuits for providing REFA and REFB uses a negative feedback technique in which N2 and ND4 are drawn such that the voltages at the terminal ends of resistor R are referenced back to voltages obtained from a resistor ladder formed from resistors 306, 308. The resistive ladder is driven by a current-source transistor 310. The current source transistor 310 is part of a current mirror circuit formed by transistors 310 and 312. Current to transistor 312 is provided from a transistor 314 which is also part of a current mirror circuit with transistor 316. The current to transistor 316 is controlled by the voltage across a resistor 318, where the voltage across the resistor 318 is controlled by a band gap reference voltage reference 320 through an operational amplifier 322, which controls a transistor current source transistor 324. This technique provides for on-chip referencing of the required ECL output levels and for control of the reference voltages in spite of variations is fabrication processes, voltages, and temperature. This technique allows $V_{OL}$, $V_{OH}$ to move with variations in $V_{DD}$.

This internal reference technique generates an ECL voltage $V_{OH}$ at node 330 and an ECL voltage $V_{OL}$ at node 332. The $V_{OH}$ and $V_{OL}$ voltages are used to control the output transistor.

A first replica stage is provided which uses PMOS transistors N1 and N2 to represent scaled-down versions of the PMOS transistors M1 and M2 in the output string of FIG. 1. The first replica stage is used for generating the control voltage REFA. The first replica stage includes a first PMOS transistor N1, having a drain terminal, a source terminal, and a gate terminal. The source terminal of N1 is connected to a $V_{DD1}$ voltage source and the gate terminal of N1 is connected to a $V_{SS1}$ voltage source to switch on N1, duplicating the on state of switch transistor M1. A second PMOS transistor N2 has a source terminal connected to the drain terminal of the first PMOS transistor N1. N2 has a gate terminal connected to the output terminal of a first operational amplifier OP1 and a drain terminal connected to the positive input terminal of OP1 and to one terminal of a resistor R.

The first operational amplifier OP1 has an output terminal which is connected to the gate of N2. The inverting input terminal of OP1 is connected to a first reference voltage $V_{OH}$ at terminal 330 provided by the current source 310 in series with the reference resistors 306, 308. The non-inverting input terminal of OP1 is connected to the drain of N2. The REFA voltage is provided at terminal 302.

In a similar fashion, a second replica stage is provided which uses NMOS transistors N3 and N4 to represent scaled-down versions of the NMOS transistors M4 and M3 in the output string of FIG. 1. This second replica stage is used for generating the control voltage REFB. The second replica stage including a first NMOS transistor N3 having a source terminal connected to a $V_{SS1}$ voltage source and a gate terminal connected to a $V_{DD1}$ voltage source to switch on N3, duplicating the on state of switch transistor M4. A second NMOS transistor N4 has a source terminal connected to the drain terminal of the first NMOS transistor N3. N4 has a gate terminal connected to the output terminal of a second operational amplifier OP2 and a drain terminal connected to the positive input terminal of OP2 and to the other terminal of resister R.

The second operational amplifier OP2 has an output terminal which is connected to the gate of N4. The inverting input terminal of OP2 is connected to a second reference voltage $V_{OL}$ at terminal 332 provided by the current source 310 in series with the reference resistors 306, 308. The non-inverting input terminal of OP2 is connected to the drain of N4. The REFB voltage is provided at terminal 304.

The operational amplifiers, designated as OP1 and OP2, in FIG. 3, drive the respective transistors N2 and N4 such that the voltages at the drain terminals of N2 and N3 equal the ECL reference input voltage $V_{OH}$ and $V_{OL}$ at the inverting input terminals of OP1 and OP2.

These control voltages generate a precise voltage drop across the reference resistor R and consequently a precise current through transistors N1, N2 and N3, N4 and also through M1, M2 and M3, M4. All of the transistor and resistor devices in the replica reference control circuit are scaled by a factor of 16 to reduce DC power dissipation. The same control voltages REFA and REFB are used for differential operation with the transistors M6 and M7 of FIG. 2.

A scaling factor of 16 is used for a 50 ohm ECL output line termination impedance. As described in connection with FIG. 5 herein below, to provide a scaling factor of 10.7 for a 75 ohm ECL output line impedance, an additional string of PMOS transistors are connected in parallel with N1 and N2 and an additional string of NMOS transistors are similarly connected in parallel with N3 and N4.

Figure 4:
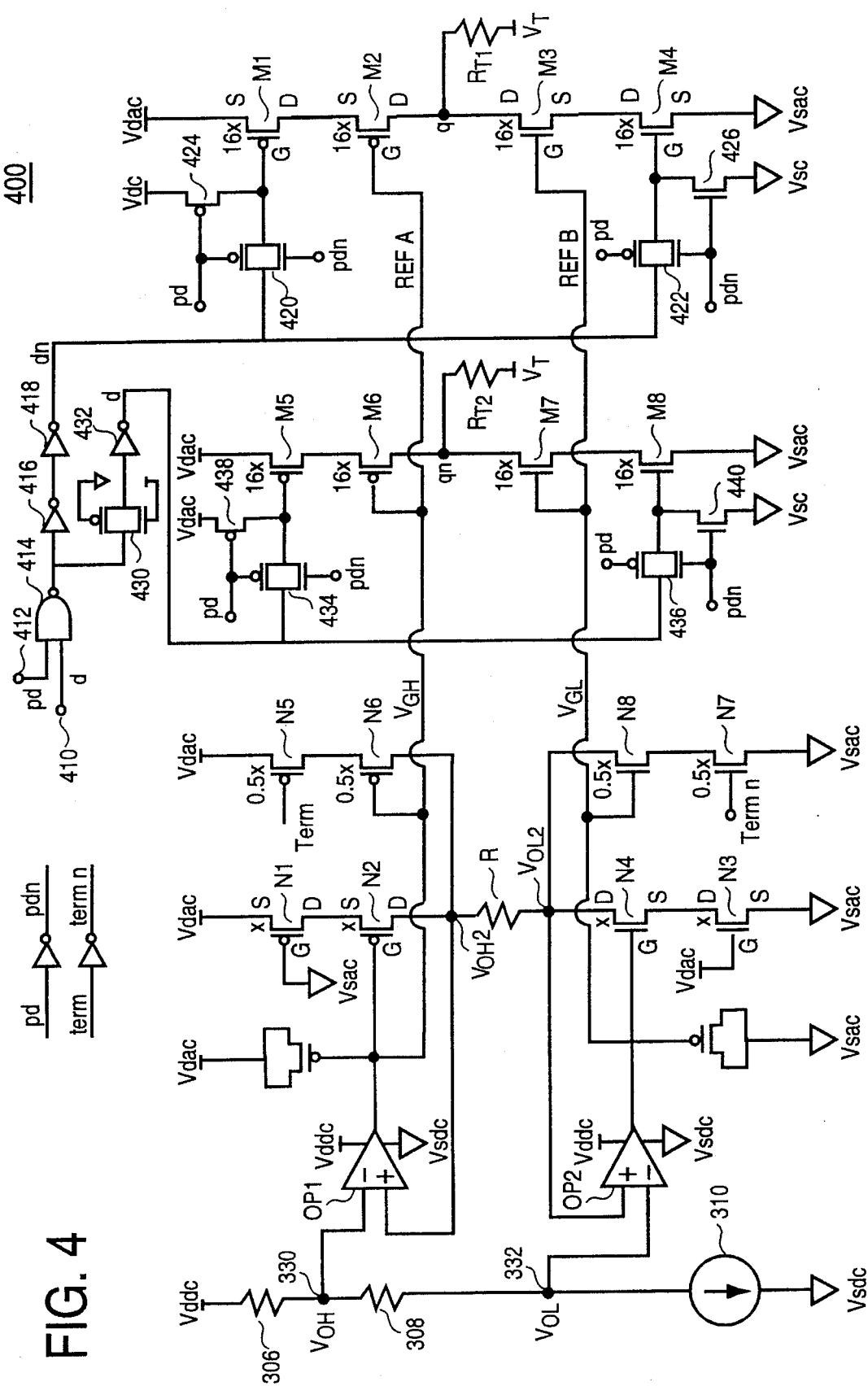
FIG. 4 shows a detailed circuit diagram of an output driver circuit according to the invention.

FIG. 4 shows a more detailed circuit diagram of an example of a CMOS-to-ECL output driver circuit 400 according to the invention. Circuits components which are similar to those of FIGS. 1, 2, and 3 use the same reference characters.

The output driver circuit has a totem-pole structure for the four MOS transistors. M1 and M2 are PMOS devices and M3 and M4 are NMOS devices. The two transistors M1 and M4 function as switches to alternatively turn on and off the current flow sourced from $V_{DD}$ or sunk to $V_{SS}$ through a resistive termination load $R_T$ having a termination voltage $V_T$ applied to one end thereof. A current source transistors M2 and a current sink transistor M3 have their gate terminals connected to respective DC voltage references REFA and REFB. These reference voltages control a precise amount of current sourced into or sunk from the load $R_T$.

The CMOS data signals d applied to terminal 410 is used to provide switching signals to thee gate terminals of M1 and M4 at up to 200 MHz. A power-down signal pd is applied to terminal 412 to save power when outputs are not operating. The d and pd signals are applied to the input terminals of a NAND gate 414 and the output signal of the NAND gate 414 is passed through two inverters 416, 418 to the input terminals of two transmission gates 420, 422, which are controlled by the pd and inverted pd (pdn) signals. The output terminals of the transmission gates 420, 422 are connected to the respective gates terminals of M1 and M4. The pd signal is applied to the gate terminal of a transistor 424 which applies a positive voltage to the gate terminal of switch transistor M1 to lock it into an OFF state when in power down mode. Similarly, the pdn signal is applied to the gate terminal of a transistor 426 which applies a positive voltage to the gate terminal of the switch transistor M4 to lock it into an OFF state when in power down mode.

In operation, the signal d causes switches M1 and M4 to be alternatively active so that M2 sources 8 MA to the load RT and M3 sinks 8 mA from the load $R_T$ and termination voltage $V_T$. Switching the power supply voltages in this manner to the source and sink transistors M2 and M3 works for a variety of power supply voltage ranges, for example, from 5 Volts to 3 volts.

The other leg of this differential amplifier arrangement is formed of the four MOS transistors, where M5 and M6 are PMOS devices and where M7 and M8 are NMOS devices. The output signal of the NAND gate 414 is applied through a series transmission gate 430 and an inverter 432 to the input terminals of two other transmission gates 434, 436, which are also controlled by the pd and inverted pd (pdn) signals. The output terminals of the transmission gates 434, 436 are connected to the respective gates terminals of M5 and M8. The pd signal is applied to the gate terminal of a transistor 438 which applies a positive voltage to the gate terminal of switch transistor M5 to lock it into an OFF state when in power down mode. Similarly, the pdn signal is applied to the gate terminal of a transistor 440 which applies a positive voltage to the gate terminal of the switch transistor M8 to lock it into an OFF state when in power down mode. Transistors M5 and M8 function as switches to alternatively turn on and off the current flow sourced from $V_{DD}$ or sunk to $V_{SS}$ through a second resistive termination load $R_T$, which also has a termination voltage $V_T$ applied to one end thereof.

The source transistors M6 and the sink transistor M7 have their gate terminals connected to the same respective DC voltage references REFA and REFB of FIG. 3, These voltage references also control a precise amount of current sourced into or sunk from the load $R_T$. The data signals d provide, oppositely-phased, inverted switching signals to the gate terminals of M5 and M8 at up to 200 MHz through the switching circuits SW3 and SW4.

The operation of the circuit of the leg formed by transistors M5, M6, M7, and M8 is similar to that of the previously described leg. M5 sources 8 MA to the load RT while M7 alternatively sinks 8 mA from the load $R_T$ and termination voltage $V_T$.

The two DC voltage references REFA at terminal 302 and REFB at terminal 304 were previously described in connection with FIG. 3 herein above. The voltage reference circuits for providing REFA and REFB uses a negative feedback technique in which these reference voltages are referenced back to voltages obtained from a resistor ladder formed from resistors 306, 308. The resistive ladder is driven by current-source transistor 310. The current source transistor 310 is part of current mirror circuit formed by transistors 310 and 312. Current to transistor 312 is provided from transistor 314 which is also part of current mirror circuit with transistor 316. The current to transistor 316 is controlled by the voltage across resistor 318, where the voltage across the resistor 318 is controlled by a band gap reference voltage reference 320 through operational amplifier 322, which controls current source transistor 324. This technique provides for on-chip referencing of the required ECL output levels and for control of the reference voltages in spite of variations is fabrication processes, voltages, and temperature.

This internal reference technique generates ECL voltage $V_{OH}$ at node 330 and ECL voltage $V_{OL}$ at node 332. The $V_{OH}$ and $V_{OL}$ voltages are used to control the output transistors N2, M6, M2 and N4, M7, M3.

The first replica stage is provided which uses PMOS transistors N1 and N2 to represent scaled-down versions of the PMOS transistors M1 and M2 in the output string of FIG. 1. The first replica stage is used for generating the control voltage REFA. The first replica stage includes first PMOS transistor N1, having a drain terminal, a source terminal, and a gate terminal. The source terminal of N1 is connected to $V_{DD1}$ voltage source and the gate terminal of N1 is connected to $V_{SS1}$ voltage source to switch on N1, duplicating the on state of switch transistor M1. The second PMOS transistor N2 has a source terminal connected to the drain terminal of the first PMOS transistor N1. N2 has a gate terminal connected to the output terminal of a first operational amplifier OP1 and a drain terminal connected to the positive input terminal of OP1 and to one terminal of a resistor R.

The first operational amplifier OP1 has an output terminal which is connected to the gate of N2. The inverting input terminal of OP1 is connected to first reference voltage VOH at terminal 330 provided by the current source 310 in series with the reference resistors 306, 308. The non-inverting input terminal of OP1 is connected to the drain of N2. The REFA voltage is provided at terminal 302.

In a similar fashion, the second replica stage is provided which uses NMOS transistors N3 and. N4 to represent scaled-down versions of the NMOS transistors M4 and M3 in the output string. This second replica stage is used for generating the control voltage REFB. The second replica stage including first NMOS transistor N3 having a source terminal connected to a $V_{SS1}$ voltage source and a gate terminal connected to a $V_{DD1}$ voltage source to switch on N3, duplicating the on state of switch transistor M4. The second NMOS transistor N4 has a source terminal connected to the drain terminal of the first NMOS transistor N3. N4 has a gate terminal connected to the output terminal of the second operational amplifier OP2 and a drain terminal connected to the positive input terminal of OP2 and to the other terminal of resistor R.

The second operational amplifier OP2 has an output terminal which is connected to the gate of N4. The inverting input terminal of OP2 is connected to second reference voltage $V_{OL}$ at terminal 332 provided by the current source 310 in series with the reference resistors 306, 308. The non-inverting input terminal of OP2 is connected to the drain of N4. The REFB voltage is provided at terminal 302.

The operational amplifiers, designated as OP1 and OP2, drive the respective transistors N2 and N4 such that the voltages at the drain terminals of N2 and N3 equal the ECL reference input voltage $V_{OH}$ and $V_{OL}$ at the inverting input terminals of OP1 and OP2.

The control voltages generate a precise voltage drop across the reference resistor R and consequently a precise current through transistors N1 and N3, N4 and also through M1, M2 and M3, M4. All of the transistor and resistor devices in the replica reference control circuit are scaled by a factor of 16 to reduce DC power dissipation. The same control voltages REFA and REFB are used for differential operation with the transistors M6 and M7.

A scaling factor of 16 is used for R to provide a 50 ohm ECL output line termination impedance. To provide a scaling factor of 10.7 for a 75 ohm ECL output line impedance, an additional string of PMOS transistors are connected in parallel with N1 and N2 and an additional string of NMOS transistors are similarly connected in parallel with N3 and N4.

The first replica stage also includes a third PMOS switch transistor N5 which has a source terminal connected to the $V_{DD1}$ voltage source. The first replica stage also includes a fourth PMOS transistor N6, having a source terminal connected to the drain terminal of the third PMOS transistor N5. The gate terminal of N6 is connected to the output terminal of the first operational amplifier OP1 and a drain terminal is connected to the non-inverting input terminal of OP1 and to the resistor R. A signal designated "term" is applied to the gate terminal of N5 to turn on the third PMOS transistor N5 and to provide for a circuit termination of 75 ohms. This provides for accommodation of a different termination impedances for the output driver circuit by providing another string of transistors N5 and N6 parallel to N1 and N2.

The second replica stage similarly includes a third NMOS transistor N7 which has a source terminal connected to the $V_{SS1}$ voltage source. The second replica stage also includes a fourth NMOS transistor N8, having a source terminal connected to the drain terminal of the third NMOS transistor N7. The gate terminal of N7 is connected to the output terminal of the second operational amplifier OP2 and a drain terminal is connected to the non-inverting input terminal of OP2 and to the resistor R. The signal designated "term n" is applied to the gate terminal of N7 to turn on the third NMOS transistor N7 and to provide for a circuit termination of 75 ohms. This provides for accommodation of a different termination impedance for the output driver circuit by providing another string of transistors N7 and N8 parallel to N3 and N4.

Figure 5:
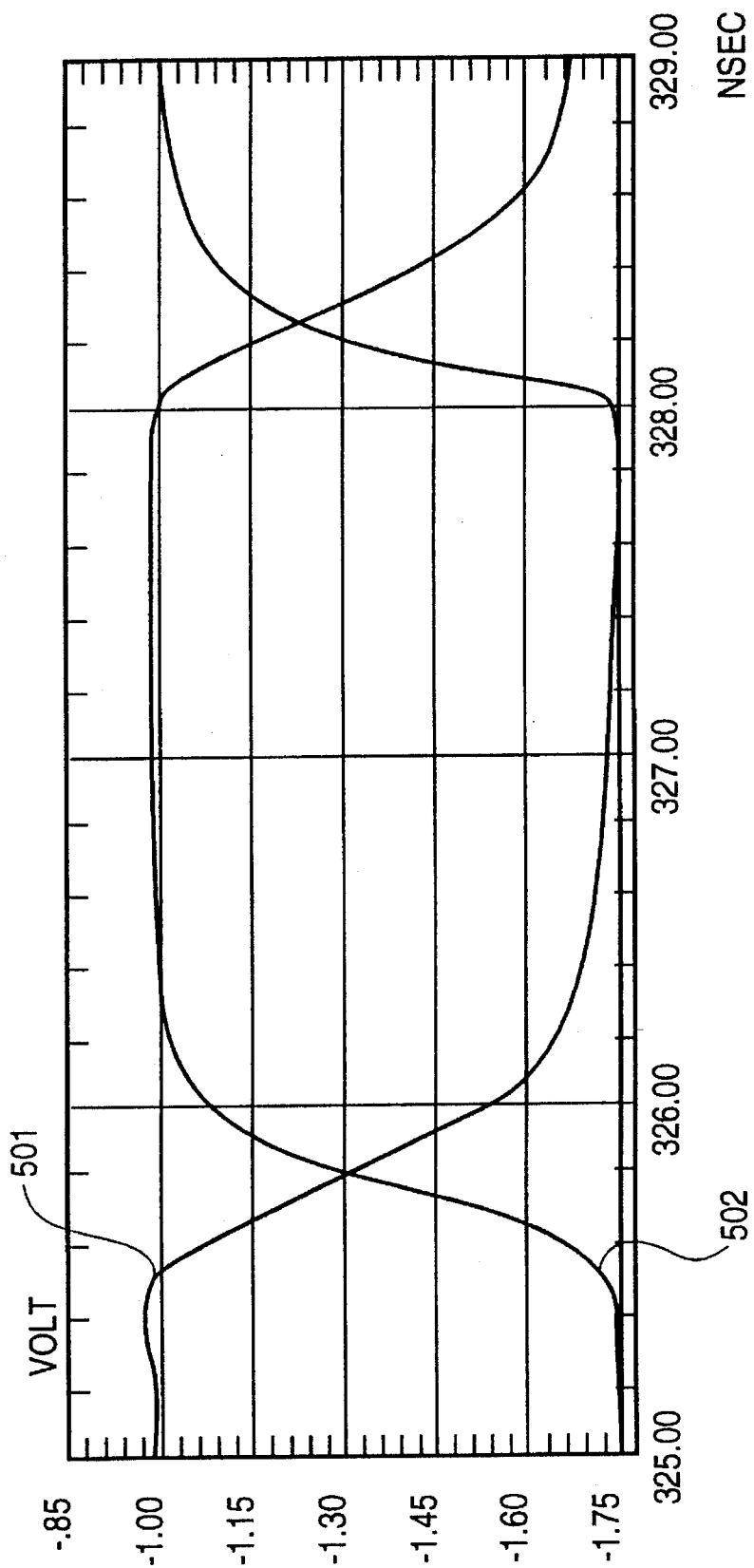
FIG. 5 is a oscillograph showing the transient response of an output driver circuit according to the invention.

FIG. 5 the transient response of a differential output driver circuit according to the invention, where waveform 501 represents an output signal q and waveform 502 represents the output at terminal qn of FIG. 4. This transient response shows that the driver circuit according to the invention can perform at 200 MHz.

A CMOS to ECL driver circuit according to the invention provides the following improvements over the prior art. The circuit maintain an overall differential power dissipation below 75 milliwatts. The circuit operates at frequencies from 20 MHz to 200 MHz. The circuit meets stringent 100 k ECL specifications with a termination voltage $V_T$ between ECL $V_{OL}$ and ECL $V_{OH}$. The circuit is fully self-contained on-chip and requires no external components, such as resistors, for reference purposes. The circuit is able to drive large external load up to 25 picofarads. The design of the circuit is such that it can withstand variations in process, voltage, and temperature.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. An output driver circuit, comprising:

a first termination resistance $R_{T1}$ which has one terminal connected to a first output terminal of the output driver circuit and which has the other terminal connected to a termination voltage source $V_T$;

a first PMOS switch transistor M1, having a drain terminal, a source terminal, and a gate terminal, wherein said source terminal is connected to a $V_{DD}$ voltage source;

first switch means for providing a first switching signal to the gate terminal of the first PMOS switch transistor M1 for turning on and off current flow from the $V_{DD}$ voltage source through the first PMOS switch transistor M1;

a second PMOS current-source transistor M2, having a drain terminal, a source terminal, and a gate terminal, wherein the source terminal of the second PMOS current-source transistor M2 is connected to the drain terminal of the first PMOS switch transistor M1 and wherein the source terminal of the second PMOS current-source transistor M2 is connected to the first output terminal of the output driver circuit;

a first DC voltage reference source REF A having an output terminal connected to the gate terminal of the second PMOS current-source transistor M2 for controlling the amount of current provided by the second PMOS current-source transistor M2 to the first termination resistance $R_{T1}$;

a first NMOS current-sink transistor M3, having a drain terminal, a source terminal, and a gate terminal, wherein the drain terminal is connected to the drain terminal of the second PMOS current-source transistor M2 and to the first output terminal of the output driver circuit;

a second DC voltage reference source REF B having an output terminal connected to the gate terminal of the first NMOS current-sink transistor M3 for controlling the amount of current provided from the first termination resistance $R_{T1}$ to the first NMOS current-sink transistor M3;

a second NMOS switch transistor M4, having a drain terminal, a source terminal, and a gate terminal, said source terminal being connected to a $V_{SS}$ voltage source, wherein the drain terminal of the second NMOS switch transistor M4 is connected to the source terminal of the first NMOS current-sink transistor M3 and wherein the source terminal of the second NMOS switch transistor N4 is connected to the $V_{SS}$ voltage source; and second switch means for providing a second switching signal to the gate terminal of the second NMOS switch transistor M4 for turning off and on current flow to the $V_{SS}$ voltage source through the second NMOS switch transistor M4.

2. The output driver circuit of claim 1:

wherein the first PMOS switch transistor M1, the second PMOS current-source transistor M2, the first NMOS current-sink transistor M3, and the second NMOS switch transistor M4 form one leg of a differential amplifier, which one leg of the differential amplifier has the first termination resistance $R_{T1}$ connected between the output terminal and the termination voltage source $V_T$; and wherein the other leg of the differential amplifier includes:

a second termination resistance $R_{T2}$ which has one terminal connected to a second output terminal of the output driver circuit and which has the other terminal connected to the termination voltage source $V_T$;

a third PMOS switch transistor M5, having a drain terminal, a source terminal, and a gate terminal, wherein said source terminal is connected to the $V_{DD}$ voltage source;

third switch means for providing a third switching signal to the gate terminal of the third PMOS switch transistor M5 for turning on and off current flow from the $V_{DD}$ voltage source through the third PMOS switch transistor M5;

a fourth PMOS current-source transistor M6, having a drain terminal, a source terminal, and a gate terminal, wherein the source terminal of the fourth PMOS current-source transistor M6 is connected to the drain terminal of the third PMOS switch transistor M5 and wherein the source terminal of the fourth PMOS current-source transistor M6 is connected to the second output terminal of the output driver circuit;

the first DC voltage reference source REF A having the output terminal thereof connected to the gate terminal of the fourth PMOS current-source transistor M6 for controlling the amount of current provided by the fourth PMOS current-source transistor M6 to the second termination resistance $R_{T2}$;

a third NMOS current-sink transistor M7, having a drain terminal, a source terminal, and a gate terminal, wherein the drain terminal is connected to the drain terminal of the first PMOS current-source transistor M2 and to the second output terminal of the output driver circuit;

the second DC voltage reference source REF B having the output terminal thereof connected to the gate terminal of the third NMOS current-sink transistor M7 for controlling the amount of current provided from the second termination resistance $R_{T2}$ to the third NMOS current-sink transistor M7;

a fourth NMOS switch transistor M8, having a drain terminal, a source terminal, and a gate terminal, said source terminal being connected to the $V_{SS}$ voltage source, wherein the drain terminal of the fourth NMOS switch transistor M8 is connected to the source terminal of the third NMOS current-sink transistor M7 and wherein the source terminal of the fourth NMOS switch transistor M8 is connected to the $V_{SS}$ voltage source;

fourth switch means for providing a fourth switching signal to the gate terminal of the fourth NMOS switch transistor M8 for turning off and on current flow to the $V_{SS}$ voltage source through the fourth NMOS switch transistor M8.

3. The output driver circuit of claim 1 wherein the first DC voltage reference source REF A includes:

a first reference voltage source;

a first operational amplifier having an output terminal, having a negative input terminal connected to the first reference voltage source, and having a positive input terminal;

a first replica stage including a first PMOS transistor N1, having a drain terminal, a source terminal, and a gate terminal, wherein said source terminal is connected to a $V_{DD1}$ voltage source, wherein said gate terminal is connected to a $V_{SS1}$ voltage source;

the first replica stage also includes a second PMOS transistor N2, having a source terminal connected to the drain terminal of the first PMOS transistor N1, having a gate terminal connected to the output terminal of the first operational amplifier, and a drain terminal connected to the positive input terminal of the first operational amplifier and connected to one terminal of a resistor R;

wherein the first DC voltage reference REF A is provided at the output terminal of the first operational amplifier.

4. The output driver circuit of claim 3 wherein the second DC voltage reference source REF B includes:

a second reference voltage source;

a second operational amplifier having an output terminal, having a negative input terminal connected to the first reference voltage source, and having a positive input terminal;

a second replica stage, including a first NMOS transistor N3, having a drain terminal, a source terminal, and a gate terminal, wherein said source terminal is connected to a $V_{SS1}$ voltage source, wherein said gate terminal is connected to the $V_{DD1}$ voltage source;

the second replica stage also includes a second NMOS transistor N4, having a source terminal connected to the drain terminal of the first NMOS transistor N3, having a gate terminal connected to the output terminal of the second operational amplifier, and a drain terminal connected to the positive input terminal of the second operational amplifier and connected to the other terminal of the resistor R; p1 wherein the second DC voltage reference REF B is provided at the output terminal of the second operational amplifier.

5. The output driver circuit of claim 3 wherein the first reference voltage source is provided by a current source in series with a reference resistor string.

6. The output driver circuit of claim 5 wherein the second reference voltage source is also provided by the current source in series with the reference resistor string.

7. The output driver circuit of claim 3 wherein the first replica stage also includes a third PMOS transistor N5, having a drain terminal, a source terminal, and a gate terminal, wherein said source terminal is connected to the $V_{DD1}$ voltage source;

the first replica stage also includes a fourth PMOS transistor N6, having a source terminal connected to the drain terminal of the third PMOS transistor N5, having a gate terminal connected to the output terminal of the first operational amplifier, and a drain terminal connected to the positive input terminal of the first operational amplifier and connected to the one terminal of the resistor R;

means for connecting the gate terminal of the third PMOS transistor N5 to the $V_{SS1}$ voltage source to turn on the third PMOS transistor N5 which provides for accommodation of a different termination impedance voltage for the output driver circuit.

8. The output driver circuit of claim 4 wherein the second replica stage also includes a third NMOS transistor N7, having a drain terminal, a source terminal, and a gate terminal, wherein said source terminal is connected to the $V_{SS1}$ voltage source;

the second replica stage also includes a fourth NMOS transistor N8, having a source terminal connected to the drain terminal of the third NMOS transistor N7, having a gate terminal connected to the output terminal of the second operational amplifier, and a drain terminal connected to the positive input terminal of the second operational amplifier and connected to the other terminal of the resistor R;

means for connecting the gate terminal of the third NMOS transistor N7 to the $V_{DD1}$ voltage source to turn on the third NMOS transistor N7 which provides for accommodation of a different termination impedance voltage for the output driver circuit.

9. The output driver circuit of claim 4 wherein the first switch means for providing a first switching signal to the gate terminal of the first PMOS switch transistor M1 for turning on and off current flow from the $V_{DD}$ voltage source through the first PMOS switch transistor M1 includes a transmission gate for controlling the passage of data signals to the gate terminal of the first PMOS switch transistor M1.

10. The output driver circuit of claim 4 wherein the second switch means for providing a second switching signal to the gate terminal of the first NMOS switch transistor M4 for turning on and off current flow to the $V_{SS}$ voltage source through the first NMOS switch transistor M3 includes a transmission gate for controlling the passage of data signals to the gate terminal of the first NMOS switch transistor M3.

11. The output driver circuit of claim 1 including switch means for disabling switch transistors M1 and M4 during a powered-down condition.

* * * * *